(12) United States Patent
Huang et al.

(10) Patent No.: US 7,923,175 B2
(45) Date of Patent: Apr. 12, 2011

(54) PHOTOMASK STRUCTURE

(75) Inventors: Chun-Chung Huang, Hsinchu (TW); Chin-Cheng Yang, Hsinchu (TW)

(73) Assignee: MACRONIX International Co. Ltd., Hsinchu (TW)

( * ) Notice: Subject to any disclaimer, the term of this patent is extended or adjusted under 35 U.S.C. 154(b) by 849 days.

(21) Appl. No.: 11/307,506

(22) Filed: Feb. 10, 2006

(65) Prior Publication Data
US 2007/0190431 A1 Aug. 16, 2007

(51) Int. Cl.
*G03F 1/00* (2006.01)
*G03C 5/00* (2006.01)

(52) U.S. Cl. ............... 430/5; 430/322; 430/324

(58) Field of Classification Search ............ 430/5, 322, 430/324
See application file for complete search history.

(56) References Cited

U.S. PATENT DOCUMENTS

| | | | |
|---|---|---|---|
| 5,831,330 A * | 11/1998 | Chang | 257/620 |
| 6,523,165 B2 | 2/2003 | Liu et al. | 716/21 |
| 6,681,379 B2 | 1/2004 | Pierrat et al. | 716/19 |
| 6,730,444 B2 * | 5/2004 | Bowes | 430/5 |
| 6,762,000 B2 | 7/2004 | Nozawa et al. | 430/5 |
| 2002/0102473 A1 * | 8/2002 | Tange et al. | 430/5 |
| 2003/0173675 A1 * | 9/2003 | Watanabe et al. | 257/758 |
| 2004/0053142 A1 * | 3/2004 | Wang et al. | 430/5 |

* cited by examiner

*Primary Examiner* — Stephen Rosasco
*Assistant Examiner* — Rashid Alam
(74) *Attorney, Agent, or Firm* — Jianq Chyun IP Office

(57) ABSTRACT

A photomask structure is described, including a substrate having multiple half-tone phase shift patterns on a device region and multiple opaque patterns on a die seal ring region. By using the photomask, a side lobe effect does not occur to the photoresist layer corresponding to the die seal ring region in the exposure step.

21 Claims, 5 Drawing Sheets

PHOTOMASK STRUCTURE

BACKGROUND OF THE INVENTION

1. Field of the Invention

The present invention relates to a photomask structure. More particularly, the present invention relates to a photomask structure that can prevent a side lobe effect.

2. Description of the Related Art

For earliest photomasks, all patterns thereon are formed from a chromium film. In a lithography process using such a photomask, the exposure light is reflected by the Cr-portions but passes the chromeless portions to transfer the photomask patterns to a photoresist layer on a wafer. However, after the process line width was reduced, many phase shift techniques were developed to improve the lithographic resolution.

Among various phase shift masks (PSM), an attenuation photomask uses, instead of chromium, a material that is semi-transparent to the exposure light and shifts the phase angle of the light by 180°. Though such a design can improve the resolution of device patterns, other problems are caused.

For example, a die seal ring for protecting a die on a wafer is not suitably formed with an attenuation photomask. Referring to FIG. 1, when a dielectric layer 100 is to be patterned into a part of a die seal ring and other structures, the photoresist pattern 210 between two adjacent gaps 102a and 102b or 102b and 102c in the die seal ring area 130 is quite narrow. If an attenuation mask is used to define the photoresist pattern 210, the diffraction of the exposure light will cause some non-predetermined portions of the photoresist layer in the die seal ring area 130 to be exposed, which is called a side lobe effect. Hence, after the development, the photoresist pattern 210 has a small gap 220 therein or is even divided into two thin photoresist rings 210a and 210b, as shown in FIGS. 2-3, so that the dielectric ring structure defined thereby has a small gap therein, or is divided into two thin rings. The thin dielectric ring structure in the die seal ring area 130 will produce a process noise, so that the process signal is easily mis-interpreted. The two thin photoresist rings 210a and 210b may even peel off in the developer flow and fall on the device area 120 or the scribe line area 110, so that the patterned dielectric layer 100 has incorrect patterns.

SUMMARY OF THE INVENTION

In view of the foregoing, this invention provides a photomask structure capable of preventing a side lobe effect to form correct photoresist patterns.

A photomask structure of this invention includes a substrate having a device region and a die seal ring region around the device region, multiple half-tone phase shift patterns on the device region, and multiple opaque patterns on the die seal ring region.

In the above photomask structure, the half-tone phase shift patterns may have a phase shift angle of 180°, and may include a metal silicide, a metal fluoride, a metal silicon oxide, a metal silicon nitride, a metal silicon nitroxide, a metal silicon carboxide, a metal silicon carbonitride, a metal silicon carbonitroxide, a metal alloy in a small thickness, a metal in a small thickness, or a combination thereof. The transparency of the half-tone phase shift patterns may be 4%-20%, preferably 6%. The material of the opaque patterns may be chromium (Cr).

Moreover, the substrate may further include a scribe line region with additional half-tone phase shift or opaque patterns thereon, wherein the die seal ring region is between the scribe line region and the device region. The phase shift angle, material and transparency of the additional half-tone phase shift patterns may be the same as those of the half-tone phase shift patterns on the device region, and the additional opaque patterns may include chromium. The material of the substrate may be quartz.

Another photomask structure of this invention includes a substrate and multiple half-tone phase shift patterns and opaque patterns on the substrate, wherein the width of the opaque patterns is smaller than that of the half-tone phase shift patterns and is also smaller than a critical width.

The above critical width may be an upper limit of a width of a half-tone phase shift pattern capable of causing a side lobe effect. The phase shift angle, material and transparency of the half-tone phase shift patterns may be the same as those mentioned above, and the material of the opaque patterns may be chromium.

Since the die seal ring region of the photomask structure is formed with opaque patterns in this invention, a side lobe effect is avoided to prevent a photoresist pattern in the die seal ring region from having a small gap therein or from peeling off, so that overly thin ring structures are not formed and the patterns can be transferred correctly.

It is to be understood that both the foregoing general description and the following detailed description are exemplary, and are intended to provide further explanation of the invention as claimed.

DESCRIPTION OF THE PREFERRED EMBODIMENTS

Figure 1:
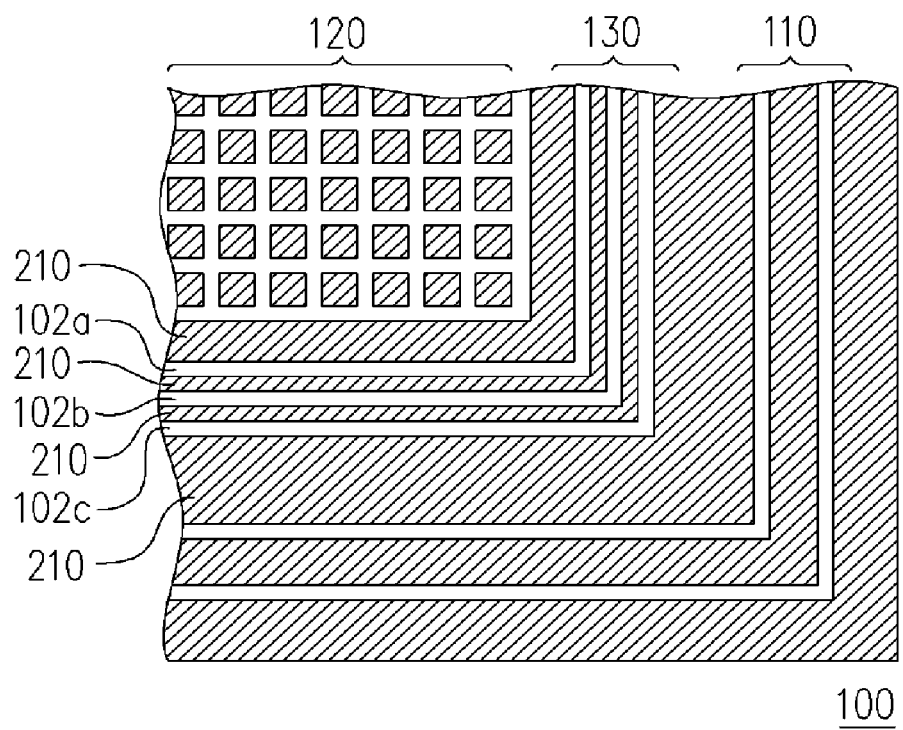
FIG. 1 illustrates a top view of a patterned photoresist layer that includes device patterns and ideal die seal ring patterns around the device patterns.
Figure 2:
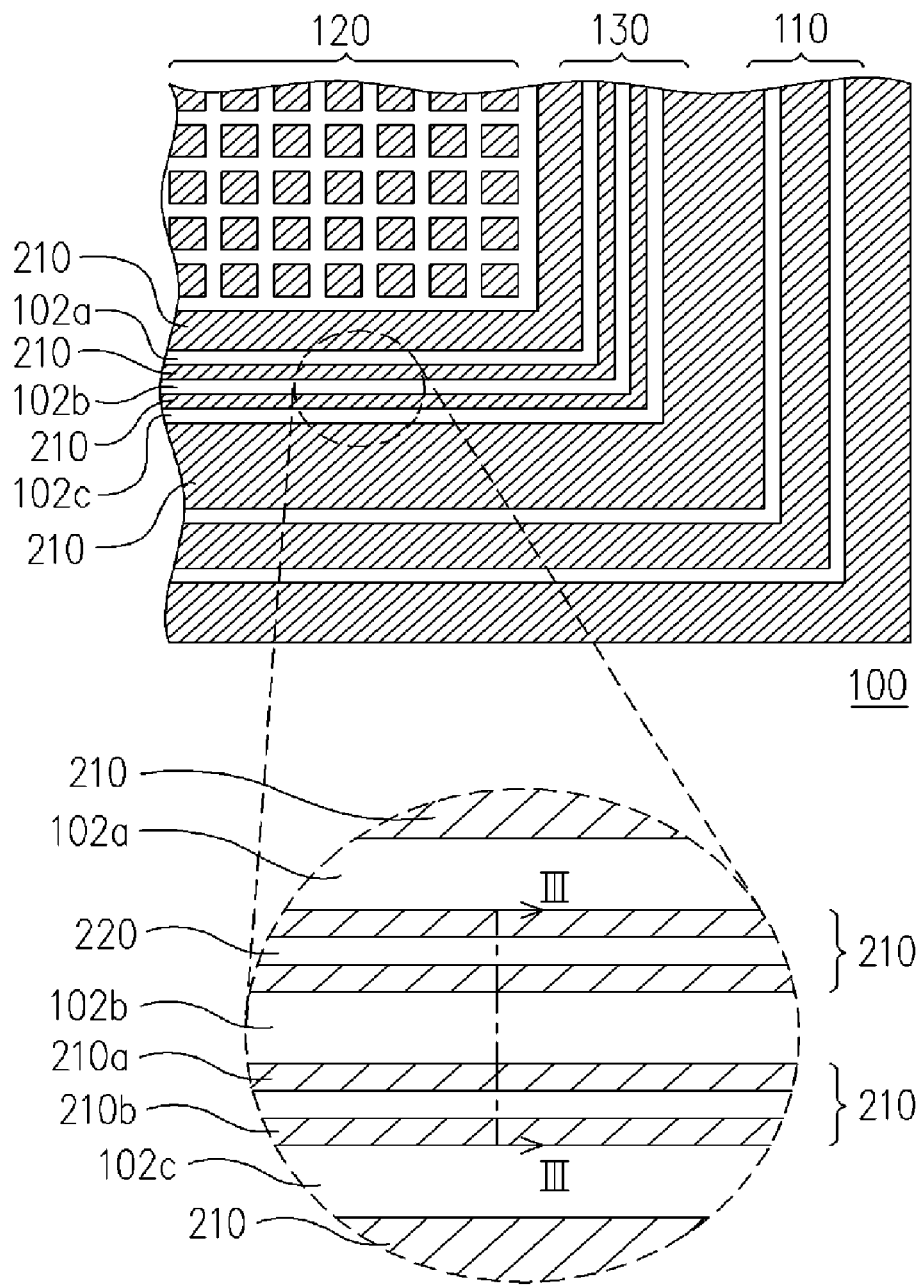
FIG. 2 illustrates a top view of a real patterned photoresist layer formed with a conventional attenuation photomask corresponding to the ideal patterns in FIG. 1.
Figure 3:
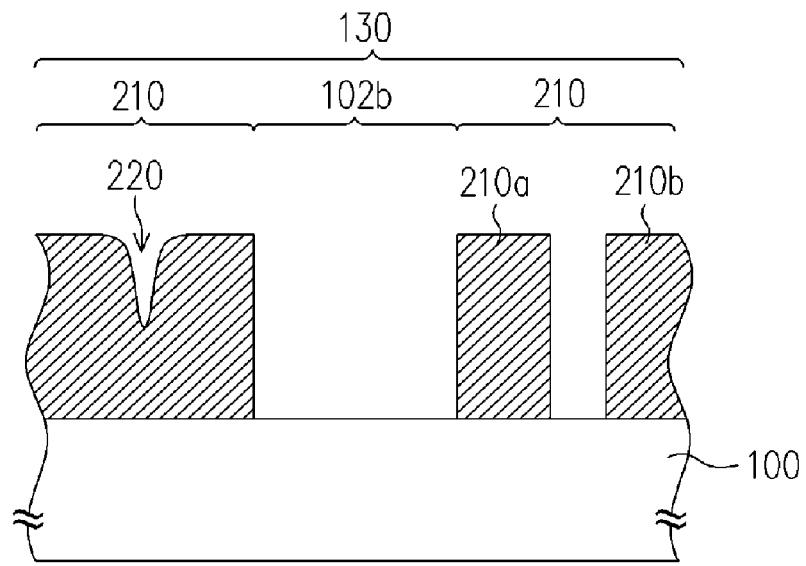
FIG. 3 illustrates a cross-sectional view of the real patterned photoresist layer of FIG. 2 along the line III-III.
Figure 4:
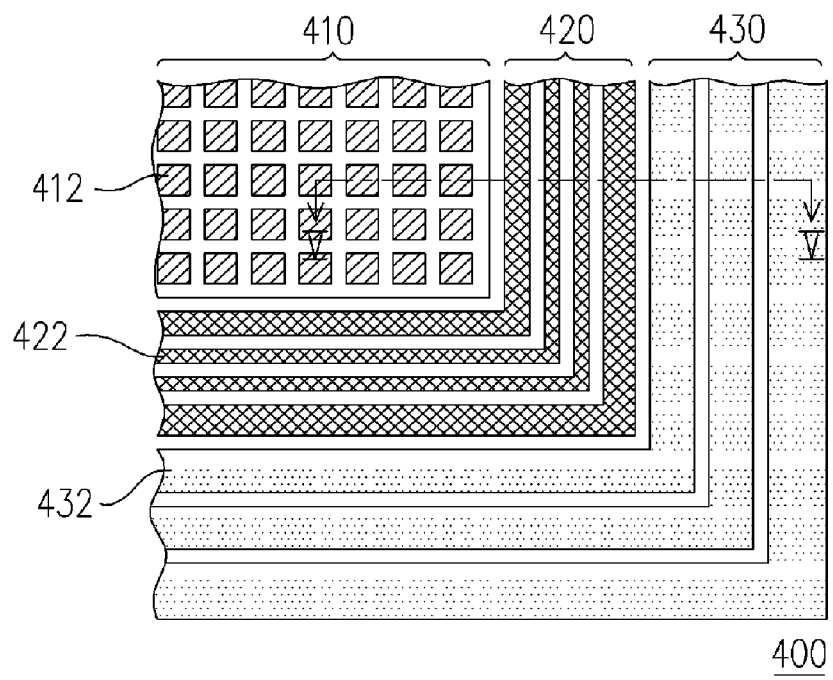
FIG. 4 depicts a top view of a photomask structure according to an embodiment of this invention.
Figure 5:
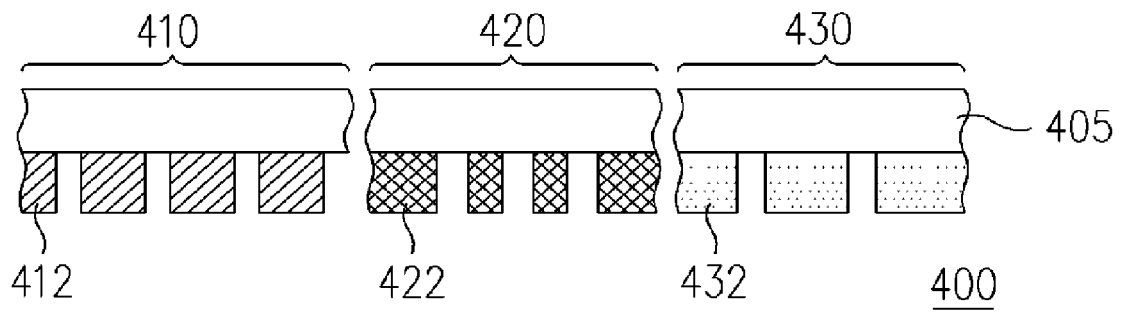
FIG. 5 depicts a cross-sectional view of the photomask structure along the line V-V.

FIG. 4/5 illustrates a top/cross-sectional view of a photomask structure according to an embodiment of this invention. The photomask 400 is made based on a substrate 405, which may include quartz, glass or any other suitable transparent material. The substrate 405 includes a device region 410 and a die seal ring region 420, multiple half-tone phase shift patterns 412 on the device region 410, and multiple opaque patterns 422 on the die seal ring region 420.

The half-tone phase shift patterns 412 may have a phase shift angle of 180°, and the material thereof may be selected from a metal silicide, a metal fluoride, a metal silicon oxide, a metal silicon nitride, a metal silicon nitroxide, a metal silicon carboxide, a metal silicon carbonitride, a metal silicon carbonitroxide, a metal alloy in a small thickness, a metal in a small thickness, and a combination thereof. The transparency of the half-tone phase shift patterns 412 may be 4%-20%, preferably 6%.

The material of the opaque patterns 422 on the die seal ring region 420 may be chromium or any other material that can completely block or reflect the exposure light, so that a side lobe effect does not occur to the photoresist layer corresponding to the die seal ring region 420. Therefore, the photoresist patterns corresponding to the die seal ring region 420 can be formed correctly to define a correct die seal ring structure.

In another embodiment, the substrate 405 further includes a scribe line region 430, on which the patterns 432 may be half-tone phase shift patterns or opaque patterns. The phase angle, material and transparency of the half-tone phase shift patterns 432 may be the same as those of the half-tone phase shift patterns 412, and the material of the opaque patterns 432 may be chromium as in the case of the opaque patterns 422.

Figure 6:
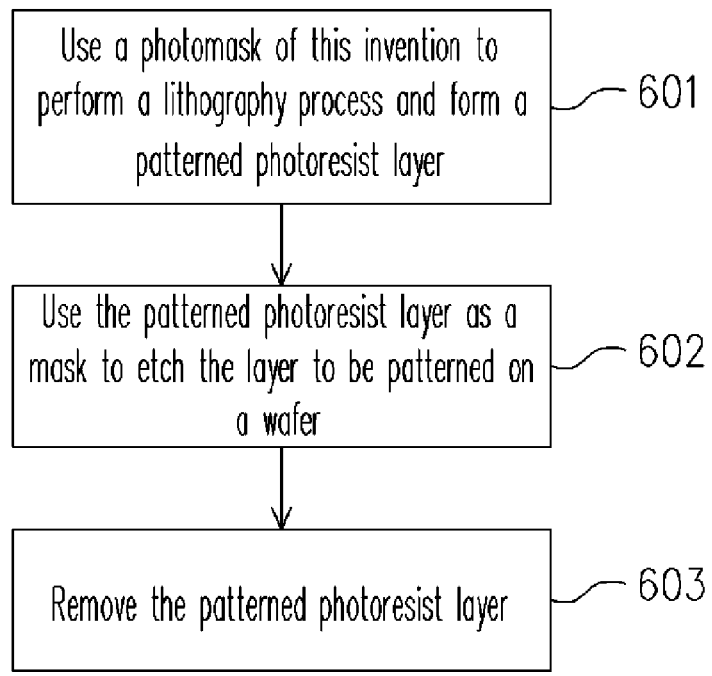
FIG. 6 is a flow chart of a patterning process using a photomask of the invention.

FIG. 6 is a flow chart of a patterning process using a photomask of the invention. In step 601, a photomask having an above-mentioned structure of this invention is used to perform a lithography process, which transfers the patterns of the photomask onto a photoresist layer on a wafer to form a patterned photoresist layer. In next step 602, the patterned photoresist layer is used as a mask to etch a layer to be patterned on the wafer, such as a dielectric layer. In next step 603, the patterned photoresist layer is removed.

Since a side lobe effect does not occur to the photoresist layer corresponding to the die seal ring region of the photomask, as mentioned above, a photoresist pattern in a die seal ring area of a wafer is prevented from having a small gap therein, and is thereby not narrowed to cause mis-interpretation of the process signal or peeling-off.

It is also noted that in the photomask structure of this invention, half-tone phase shift patterns are not limited to dispose on the device region and opaque patterns are not limited to dispose on the die seal ring region. Generally, half-tone phase shift patterns can be disposed on a region of a larger line width, and opaque patterns can be disposed on a region of a smaller line width that is also smaller than a critical width, wherein the critical width is an upper limit of a width of a half-tone phase shift pattern capable of causing a side lobe effect.

Figure 7:
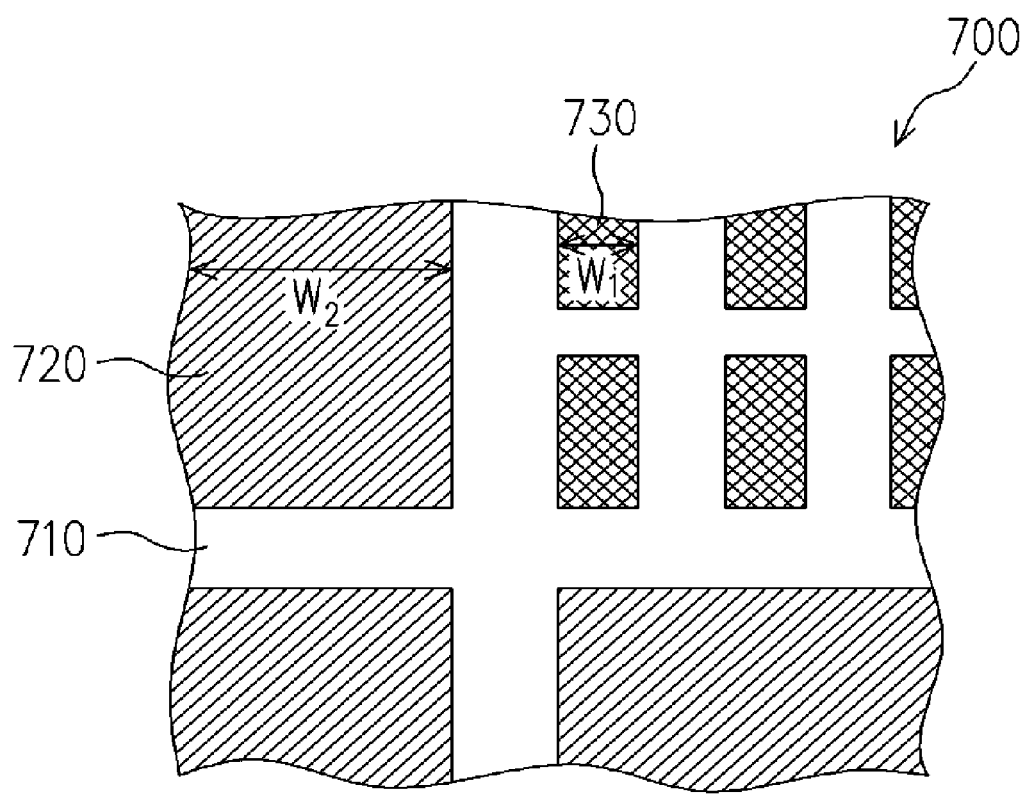
FIG. 7 is a top view of a photomask structure according to another embodiment of this invention.

For example, FIG. 7 shows a photomask structure of such an embodiment in a top view. The photomask structure 700 includes a substrate 710 and multiple half-tone phase shift patterns 720 and opaque patterns 730 thereon, wherein possible materials of the patterns 720 and 730 are the same as above. The width ($W_1$) of the opaque patterns 730 is smaller than that ($W_2$) of the half-tone phase shift patterns 720 and also smaller than a critical width that is an upper limit of a width of a half-tone phase shift pattern capable of causing a side lobe effect. In some embodiments, the opaque patterns 730 and the half-tone phase shift patterns 720 are used to form patterns of different widths in a device area on a wafer. In other words, as the predetermined width of a photoresist pattern is smaller that the critical width, an opaque pattern is suitably disposed on the corresponding position of the photomask so that a side lobe effect does not occur to the corresponding portion of the photoresist layer. Thereby, all of the photoresist patterns on the wafer can be formed correctly.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A photomask structure, comprising:
   a substrate, including a device region and a die seal ring region around the device region;
   a plurality of first half-tone phase shift patterns only on the device region; and
   a plurality of first opaque patterns directly on the die seal ring region of the substrate.

2. The photomask structure of claim 1, wherein the first half-tone phase shift patterns have a phase shift angle of 180°.

3. The photomask structure of claim 1, wherein the first half-tone phase shift patterns comprise a metal sificide, a metal fluoride, a metal silicon oxide, a metal silicon nitride, a metal silicon nitroxide, a metal silicon carboxide, a metal silicon carbonitride, a metal silicon carbonitroxide, a metal alloy in a small thickness, a metal in a small thickness, or a combination thereof.

4. The photomask structure of claim 1, wherein the first half-tone phase shift patterns have a transparency between 4% and 20%.

5. The photomask structure of claim 4, wherein the first half-tone phase shift patterns have a transparency of 6%.

6. The photomask structure of claim 1, wherein the first opaque patterns comprise chromium.

7. The photomask structure of claim 1, wherein the substrate further comprises a scribe line region with a plurality of second half-tone phase shift patterns thereon, and the die seal ring region is between the scribe line region and the device region.

8. The photomask structure of claim 7, wherein the second half-tone phase shift patterns have a phase shift angle of 180°.

9. The photomask structure of claim 7, wherein the second half-tone phase shift patterns comprise a metal silicide, a metal fluoride, a metal silicon oxide, a metal silicon nitride, a metal silicon nitroxide, a metal silicon carboxide, a metal silicon carbonitride, a metal silicon carbonitroxide, a metal alloy in a small thickness, a metal in a small thickness, or a combination thereof.

10. The photomask structure of claim 7, wherein the second half-tone phase shift patterns have a transparency between 4% and 20%.

11. The photomask structure of claim 10, wherein the second half-tone phase shift patterns have a transparency of 6%.

12. The photomask structure of claim 1, wherein the substrate further comprises a scribe line region with a plurality of second opaque patterns thereon, and the die seal ring region is between the scribe line region and the device region.

13. The photomask structure of claim 12, wherein the second opaque patterns comprise chromium.

14. The photomask structure of claim 1, wherein the substrate comprises quartz.

15. A photomask structure, comprising:
   a substrate;
   a plurality of half-tone phase shift patterns on the substrate; and
   a plurality of opaque patterns directly on the die seal region and directly on the substrate, having a width smaller than a width of the half-tone phase shift patterns and also smaller than a critical width.

16. The photomask structure of claim 15, wherein the critical width is an upper limit of a width of a half-tone phase shift pattern capable of causing a side lobe effect.

17. The photomask structure of claim 15, wherein the half-tone phase shift patterns have a phase shift angle of 180°.

18. The photomask structure of claim 15, wherein the first half-tone phase shift patterns comprise a metal silicide, a metal fluoride, a metal silicon oxide, a metal silicon nitride, a metal silicon nitroxide, a metal silicon carboxide, a metal silicon carbonitride, a metal silicon carbonitroxide, a metal alloy in a small thickness, a metal in a small thickness, or a combination thereof.

19. The photomask structure of claim 15, wherein the half-tone phase shift patterns have a transparency between 4% and 20%.

20. The photomask structure of claim 19, wherein the half-tone phase shift patterns have a transparency of 6%.

21. The photomask structure of claim 15, wherein the opaque patterns comprise chromium.

* * * * *